(12) United States Patent
Tsukada (10) Patent No.: US 12,250,778 B2
(45) Date of Patent: Mar. 11, 2025

(54) CIRCUIT BOARD MANUFACTURING METHOD AND CIRCUIT BOARD MANUFACTURING DEVICE

(71) Applicant: FUJI CORPORATION, Chiryu (JP)

(72) Inventor: Kenji Tsukada, Toyota (JP)

(73) Assignee: FUJI CORPORATION, Chiryu (JP)

( * ) Notice: Subject to any disclaimer, the term of this patent is extended or adjusted under 35 U.S.C. 154(b) by 665 days.

(21) Appl. No.: 17/613,520

(22) PCT Filed: Jun. 18, 2019

(86) PCT No.: PCT/JP2019/024111
§ 371 (c)(1),
(2) Date: Jun. 30, 2022

(87) PCT Pub. No.: WO2020/255258
PCT Pub. Date: Dec. 24, 2020

(65) Prior Publication Data
US 2022/0354000 A1   Nov. 3, 2022

(51) Int. Cl.
*H05K 3/32* (2006.01)
*B23K 1/00* (2006.01)
(Continued)

(52) U.S. Cl.
CPC ............. *H05K 3/32* (2013.01); *B23K 1/0016* (2013.01); *B33Y 30/00* (2014.12); *B23K 2101/36* (2018.08); *B33Y 80/00* (2014.12)

(58) Field of Classification Search
CPC ........ H05K 1/144; H05K 1/186; H05K 3/007; H05K 3/10; H05K 3/125; H05K 3/1283;
(Continued)

(56) References Cited

U.S. PATENT DOCUMENTS

| 2002/0036054 A1* | 3/2002 | Nakatani | H01L 25/0652 428/209 |
| 2002/0147521 A1* | 10/2002 | Mok | G05B 19/4099 700/118 |

(Continued)

FOREIGN PATENT DOCUMENTS

JP   2007-311476 A   11/2007

OTHER PUBLICATIONS

International Search Report issued on Aug. 27, 2019 in PCT/JP2019/024111 filed on Jun. 18, 2019, 2 pages.

*Primary Examiner* — Aneeta Yodichkas
*Assistant Examiner* — Joshua D Anderson
(74) *Attorney, Agent, or Firm* — Oblon, McClelland, Maier & Neustadt, L.L.P.

(57) ABSTRACT

In a method for manufacturing a circuit board according to an additive manufacturing shaping method, a circuit board manufacturing method and a circuit board manufacturing device that can reduce the influence of thermal stress on a circuit board by reducing the number of heating steps are provided. A circuit board manufacturing method according to the present disclosure includes a board shaping step of laminating and shaping a circuit board having a wiring on a peeling member adhered to a base member, an attachment step of attaching a metal paste contacting the wiring to the circuit board, an electronic component arrangement step of arranging an electronic component on the circuit board to arrange the electronic component and the wiring via the metal paste, and a heating press step of arranging a press member above the circuit board, and causing the peeling member to be easily released from the base member and curing the metal paste by collectively heating the peeling member and the metal paste while pressing the circuit board (Continued)

with the base member and the press member to correct warpage of the circuit board.

8 Claims, 8 Drawing Sheets

(51) Int. Cl.
*B23K 101/36* (2006.01)
*B33Y 30/00* (2015.01)
*B33Y 80/00* (2015.01)

(58) Field of Classification Search
CPC ........ H05K 3/1291; H05K 3/305; H05K 3/32; H05K 3/321; H05K 3/4611; H05K 3/4644; H05K 3/4664; H05K 2201/0311; H05K 2201/0314; H05K 2201/042; H05K 2201/09136; H05K 2201/10242; H05K 2203/013; H05K 2203/0152; Y10T 29/49124; Y10T 29/4913; Y10T 29/49144; B33Y 10/00; B33Y 30/00; B33Y 40/20

See application file for complete search history.

(56) References Cited

U.S. PATENT DOCUMENTS

| | | | |
|---|---|---|---|
| 2004/0000429 A1* | 1/2004 | Furusawa | H05K 3/4647 29/846 |
| 2005/0155706 A1* | 7/2005 | Nishida | H01L 21/563 257/E21.511 |
| 2006/0134907 A1* | 6/2006 | Ikeda | H05K 1/187 438/629 |
| 2007/0286946 A1* | 12/2007 | Yamaguchi | H01L 21/6835 257/E23.178 |
| 2013/0261262 A1* | 10/2013 | Cox | B32B 3/08 525/217 |
| 2014/0231266 A1* | 8/2014 | Sherrer | B29C 70/882 164/94 |
| 2015/0201500 A1* | 7/2015 | Shinar | B29C 64/112 425/132 |

* cited by examiner

CIRCUIT BOARD MANUFACTURING METHOD AND CIRCUIT BOARD MANUFACTURING DEVICE

TECHNICAL FIELD

The present disclosure relates to a method for manufacturing a circuit board having wirings by using an additive manufacturing method and a circuit board manufacturing device.

BACKGROUND ART

Conventionally, a technique for forming an insulating layer of a board with a curable viscous fluid such as an ultraviolet curable resin has been developed. For example, in a manufacturing method disclosed in Patent Literature 1, after two types of curable resins are ejected from an inkjet device and cured, only one of the two types of curable resins is removed, so that an accommodation section in which an electronic component is arranged is formed in an insulating layer. Next, the electronic component is arranged in the accommodation section, and the accommodation section and the electronic component are covered with a resin film. A Via hole and wires are formed in the insulating layer formed of the resin film, and thus a component-containing board in which the electronic component is embedded is manufactured.

PATENT LITERATURE

Patent Literature 1: JP-A-2007-311476

BRIEF SUMMARY

Technical Problem

However, in a case where a board is manufactured by using the above-described additive manufacturing method, heat is generated in various manufacturing steps. In order to protect a board to be manufactured from thermal stress caused by heating, it is preferable to reduce the number of heating steps.

The present disclosure has been made in view of such circumstances, and an object of the present disclosure is to provide a method for manufacturing a circuit board and a circuit board manufacturing device that can reduce the influence of thermal stress on a circuit board by reducing the number of heating steps in a method for manufacturing a circuit board by using an additive manufacturing method.

In order to achieve the object, according to the present disclosure, there is provided a circuit board manufacturing method including a board shaping step of laminating and shaping a circuit board having a wiring on a peeling member adhered to a base member; an attachment step of attaching a metal paste contacting the wiring to the circuit board; an electronic component arrangement step of arranging an electronic component on the circuit board to arrange the electronic component and the wiring via the metal paste; and a heating press step of arranging a press member above the circuit board, and causing the peeling member to be easily released from the base member and curing the metal paste by collectively heating the peeling member and the metal paste while pressing the circuit board with the base member and the press member to correct warpage of the circuit board.

In order to achieve the object, according to the present disclosure, there is provided a circuit board manufacturing device including an additive manufacturing device; a mounting head; a heating press device; and a control device, in which the control device includes a board shaping section configured to cause the additive manufacturing device to additively form a circuit board having a wiring on a peeling member adhered to a base member, an attachment section configured to attach a metal paste contacting the wiring to the circuit board, an electronic component arrangement section configured to cause the mounting head to arrange an electronic component on the circuit board to arrange the electronic component and the wiring via the metal paste, and a heating press section configured to arrange a press member above the circuit board, cause the heating press device to move the press member, and release the peeling member from the base member and cure the metal paste by causing the heating press device to collectively heat the peeling member and the metal paste while pressing the circuit board with the base member and the press member to correct warpage of the circuit board.

Advantageous Effects

The peeling member of the present disclosure has a property of being released from the base member, for example, by being heated. The metal paste is arranged between the electronic component and the wiring, and is cured by being heated to electrically connect the electronic component and the wiring. In the circuit board manufacturing method and the circuit board manufacturing device of the present disclosure, the peeling member and the metal paste are collectively heated while correcting the warpage of the circuit board due to heating through the pressing of the base member and the press member. Consequently, the two heating steps including the step of heating the peeling member and the step of heating the metal paste can be combined to heat the circuit board while suppressing warpage of the circuit board. The influence of thermal stress on the circuit board can be reduced by reducing the number of heating steps, and thus the quality of the circuit board after manufacturing can be improved. By reducing the number of manufacturing steps, the production efficiency can be improved, and thus the manufacturing cost can be reduced.

DESCRIPTION OF EMBODIMENTS (1. Configuration of Circuit Board Manufacturing Device)

Figure 1:
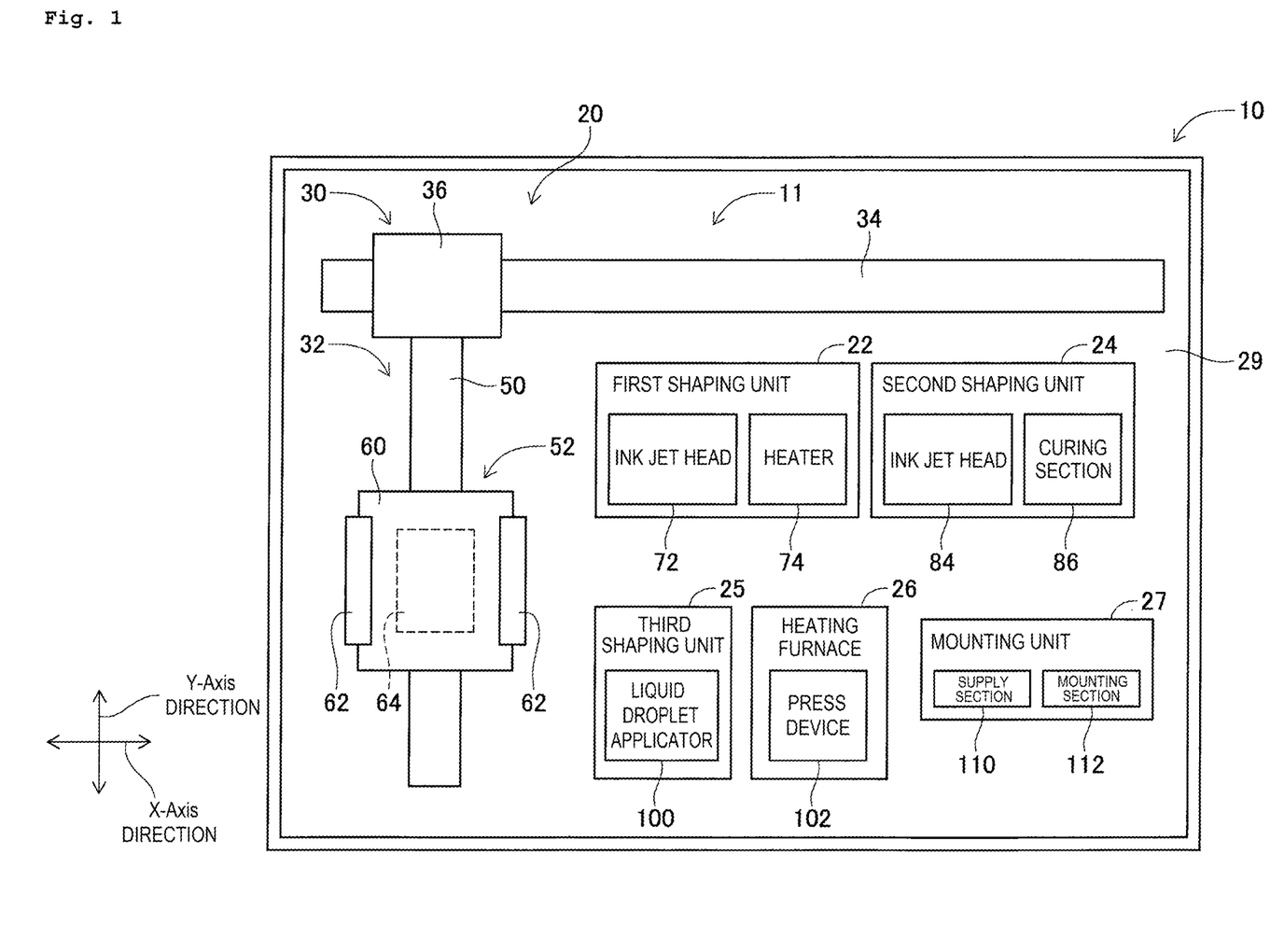
FIG. 1 a diagram illustrating a circuit board manufacturing device.

FIG. 1 illustrates circuit board manufacturing device (hereinafter, referred to as a "manufacturing device") 10 according to an embodiment that embodies a circuit board manufacturing device of the present disclosure. Manufacturing device 10 includes conveyance device 20, first shaping unit 22, second shaping unit 24, third shaping unit 25, heating oven 26, mounting unit 27, and control device 28 (refer to FIG. 2). Conveyance device 20, first shaping unit 22, second shaping unit 24, third shaping unit 25, heating oven 26, and mounting unit 27 are arranged above base 29 of manufacturing device 10. Base 29 has a generally rectangular shape, and in the following description, a longitudinal direction of base 29 will be referred to as an X-axis direction, a lateral direction of base 29 will be referred to as a Y-axis direction, and a direction orthogonal to both the X-axis direction and the Y-axis direction will be referred to as a Z-axis direction.

Conveyance device 20 includes X-axis slide mechanism 30 and Y-axis slide mechanism 32. X-axis slide mechanism 30 includes X-axis slide rail 34 and X-axis slider 36. X-axis slide rail 34 is disposed on base 29 such as X-axis slide rail 34 extends in the X-axis direction. X-axis slider 36 is held by X-axis slide rail 34 such as X-axis slider 36 is slidable in the X-axis direction. X-axis slide mechanism 30 further includes an electromagnetic motor 38 (refer to FIG. 2), and thus X-axis slider 36 is moved to any position in the X-axis direction by driving electromagnetic motor 38.

Y-axis slide mechanism 32 includes Y-axis slide rail 50 and stage 52. Y-axis slide rail 50 is disposed on base 29 such that Y-axis slide rail 50 extends in the Y-axis direction. One end part of Y-axis slide rail 50 in the Y-axis direction is coupled to X-axis slider 36. Consequently, Y-axis slide rail 50 is configured to be movable in the X-axis direction in accordance with a sliding movement of X-axis slider 36. Stage 52 is held on Y-axis slide rail 50 such that stage 52 is slidable in the Y-axis direction. Y-axis slide mechanism 32 further includes electromagnetic motor 56 (refer to FIG. 2), and thus stage 52 is moved to any position in the Y-axis direction by driving electromagnetic motor 56. Consequently, stage 52 is moved to any position above base 29 by driving X-axis slide mechanism 30 and Y-axis slide mechanism 32.

Stage 52 includes base plate 60, holding devices 62, and lifting/lowering device 64. Base plate 60 is formed in a flat plate shape, and base member 131 (refer to FIG. 4) is placed on an upper surface thereof. Base member 131 is, for example, a plate made of a metal such as iron or stainless steel. Holding devices 62 are provided on both side parts of base plate 60 in the X-axis direction. Holding device 62 fixedly holds base member 131 by sandwiching both edge portions in the X-axis direction of base member 131 placed on base plate 60. Lifting/lowering device 64 is disposed below base plate 60 and moves up and down base plate 60 in the Z-axis direction.

First shaping unit 22 is a unit shaping a wiring on base member 131, and includes ink jet head 72 and heater 74. Ink jet head 72 ejects metal ink. The metal ink is, for example, one in which fine particles of a metal (silver or the like) having a nanometer size are dispersed in a solvent. Surfaces of the metal fine particles are coated with, for example, a dispersing agent to prevent aggregation in the solvent. Ink jet head 72 ejects the metal ink from multiple nozzles according to, for example, a piezo method using piezoelectric elements. A device ejecting the metal ink is not limited to ink jet head 72 including multiple nozzles, and may be, for example, a dispenser including one nozzle.

Heater 74 is a device heating the metal ink ejected from ink jet head 72, and heats and bakes the metal ink to form cured wirings. Baking of the metal ink described here is, for example, a phenomenon in which evaporation of a solvent, decomposition of a protective film of metal fine particles, that is, a dispersing agent, or the like is performed by applying energy, so that conductivity is increased by contacting or fusing the metal fine particles. The metal ink is baked to form a metal wiring. A device heating the metal ink is not limited to heater 74. For example, manufacturing device 10 may include a laser irradiation device that irradiates to the metal ink with laser light as a device heating the metal ink.

Second shaping unit 24 is a unit that shapes an insulating layer made of resin on base member 131 (refer to FIG. 4), and includes ink jet head 84 and curing section 86. Ink jet head 84 ejects an ultraviolet curable resin. The ultraviolet curable resin is a resin that is cured through irradiation with ultraviolet rays. Ink jet head 84 may eject the ultraviolet curable resin according to, for example, a piezo method using a piezoelectric element, or may eject the ultraviolet curable resin according to a thermal method in which air bubbles are generated by heating the ultraviolet curable resin and ejected from multiple nozzles. As the resin for forming an insulating layer, not only an ultraviolet curable resin but also another type of resin such as a thermosetting resin may be employed.

Figure 2:
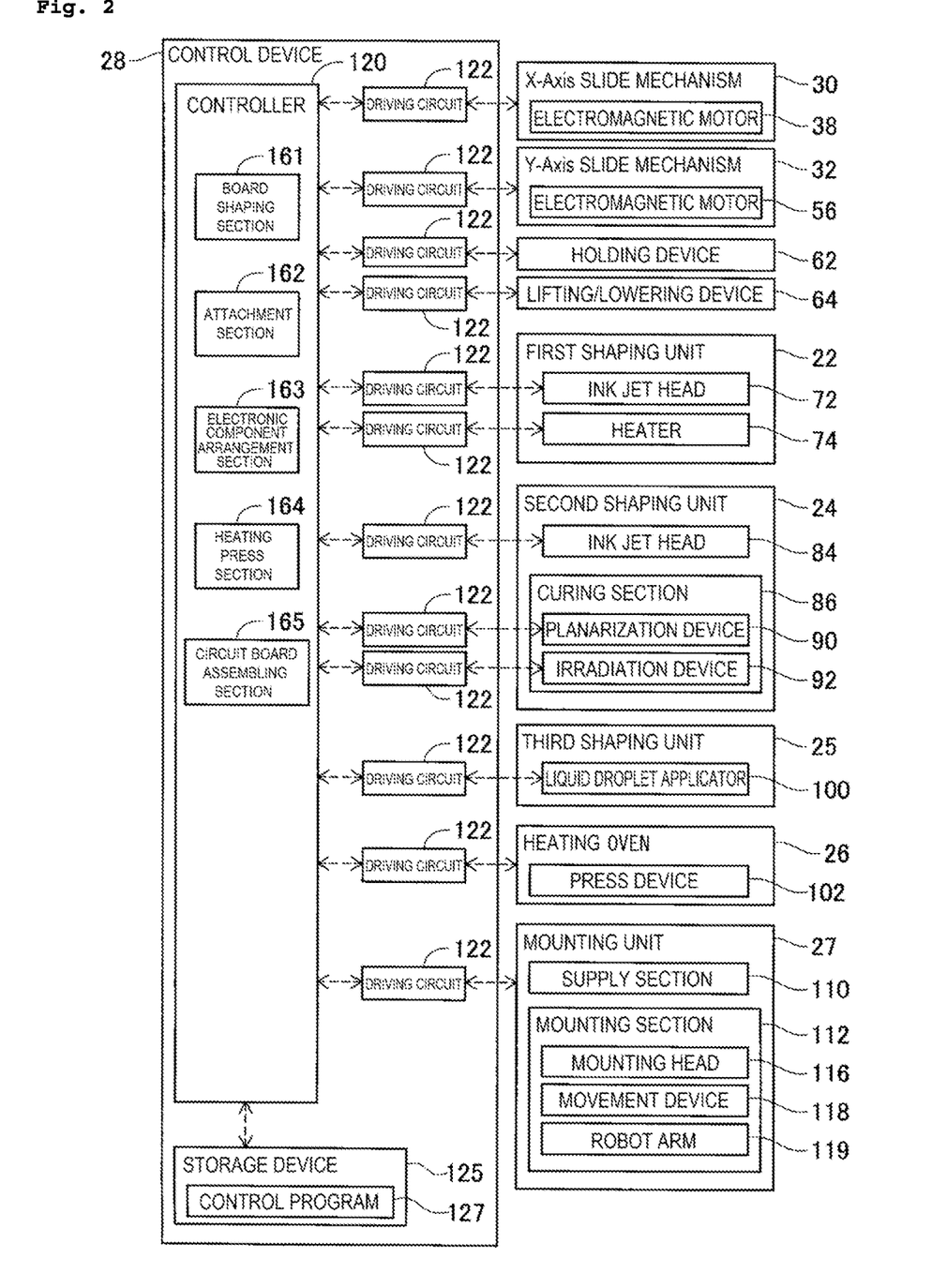
FIG. 2 is a block diagram illustrating a control device.

Curing section 86 includes planarization device 90 (refer to FIG. 2) and irradiation device 92 (refer to FIG. 2). Planarization device 90 is a device that planarizes the ultraviolet curable resin ejected by ink jet head 84, and, for example, uniformizes a thickness of the ultraviolet curable resin by scraping off an excess resin with a roller or a blade while leveling the surface of the ultraviolet curable resin. Irradiation device 92 includes a mercury lamp or an LED as a light source, and irradiates the ejected ultraviolet curable resin with ultraviolet rays. Consequently, the ejected ultraviolet curable resin is cured, and thus an insulating layer is formed. As the additive manufacturing method in the present disclosure, not only a stereo lithography (SL), but also other methods such as a selective laser sintering (SLS) and a fused deposition molding (FDM) may be employed.

Third shaping unit 25 is a unit that shapes a connection section (a bump or the like) between an electrode and a wiring of an electronic component on base member 131, and includes liquid droplet applicator 100. Liquid droplet applicator 100 applies a conductive resin paste to wirings or the like. The conductive resin paste is, for example, one in which metal particles (silver or the like) having a micrometer size are dispersed in a resin to be cured by being heated. The metal particles are formed in a flake shape. As a method for applying the conductive resin paste, a method for causing liquid droplets to fly from a nozzle such as a dispenser or a method for performing contact application may be employed.

Heating oven 26 is, for example, an atmosphere oven, and includes a circulation device that circulates an atmospheric gas, a heating element that heats the inside of the oven, and the like. Heating oven 26 is a device that heats the conductive resin paste, and heats the insulating layer on which the conductive resin paste is ejected in the oven to cure the resin of the conductive resin paste. In this case, in the conductive resin paste, the cured resin shrinks, and the dispersed flake-shaped metal particles contact the resin. Consequently, the conductive resin paste becomes conductive.

As will be described later, when a circuit board is manufactured, a release film (an example of a peeling member; refer to FIG. 4) may be adhered onto base member 131. First shaping unit 22 and second shaping unit 24 form an insulating layer and a wiring on the release film, and additively form a circuit board. The adhesive force of the release film is reduced by being heated, and thus the release film is easily released from base member 131. Heating oven 26 collectively heats both the conductive resin paste and the release film by heating the circuit board on which the conductive resin paste is ejected in the oven.

Heating oven 26 includes press device 102. Heating oven 26 performs a heating process while pressing the circuit board with press device 102. Consequently, the conductive resin paste and the release film can be heated while suppressing the occurrence of warpage in the circuit board.

Mounting unit 27 is a unit that mounts electronic components on a circuit board, and includes supply section 110 and mounting section 112. Supply section 110 includes, for example, multiple tape feeders that feed taped electronic components one by one, and supplies the electronic component at a supply position. Supply section 110 is not limited to the configuration including the tape feeders, and may be a tray-type supply device that picks up an electronic component from a tray and supplies the electronic component. Supply section 110 may be configured to include both the tape-type supply device and the tray-type supply device, or another type of supply device.

Mounting section 112 includes mounting head 116 (refer to FIG. 2) and movement device 118 (refer to FIG. 2). Mounting head 116 has a suction nozzle (not illustrated) for picking up and holding an electronic component. The suction nozzle picks up and holds the electronic component by suctioning air when a negative pressure is supplied from a positive and negative pressure supply device (not illustrated). When a slight positive pressure is supplied from the positive and negative pressure supply device, the electronic component is separated. Movement device 118 moves mounting head 116 between a supply position of supply section 110 and base member 131 placed on base plate 60. Mounting section 112 moves mounting head 116, picks up and holds an electronic component supplied from supply section 110 with the suction nozzle of mounting head 116, and mounts the picked-up and held electronic component on the circuit board.

Mounting section 112 includes robot arm 119. Robot arm 119 is a device that manufactures a combined circuit board by combining circuit boards on which electronic components are mounted. Robot arm 119 detaches the circuit boards from release films, and combines multiple detached circuit boards to manufacture a combined circuit board.

As illustrated in FIG. 2, control device 28 includes controller 120, multiple driving circuits 122, and storage device 125. Multiple driving circuits 122 are respectively connected to the above-described electromagnetic motors 38 and 56, holding device 62, lifting/lowering device 64, ink jet head 72, heater 74, ink jet head 84, planarization device 90, irradiation device 92, liquid droplet applicator 100, heating oven 26, and mounting unit 27. Controller 120 includes a CPU, a ROM, a RAM, and the like, and is mainly a computer, and is connected to multiple driving circuits 122. Storage device 125 includes a RAM, a ROM, a hard disk, and the like, and stores control program 127 for performing control of manufacturing device 10. Controller 120 can control operations of X-axis slide mechanism 30, first shaping unit 22, and the like by executing control program 127 with the CPU.

Manufacturing device 10 of the present embodiment additively forms a circuit board having an insulating layer and a wiring by curing an ultraviolet curable resin or metal ink according to the above configuration. Manufacturing device 10 can shape a circuit board having any shape by changing a shape of an insulating layer or a wiring to be additively formed. Manufacturing device 10 mounts electronic components with third shaping unit 25 or mounting unit 27 in the process of shaping. For example, three-dimensional data of each layer obtained by slicing a circuit board at the time of completion (circuit board 137 or combined circuit board 155 that will be described later) thereof is set in control program 127. Controller 120 controls first shaping unit 22 or the like based on the data of control program 127 to eject, cure, or the like an ultraviolet curable resin to form a circuit board on which electronic components are not connected. Controller 120 detects information such as a layer or a position where an electronic component is arranged based on the data of control program 127. Controller 120 controls third shaping unit 25 or mounting unit 27 based on the detected information to eject a conductive resin paste and arrange the electronic components. Controller 120 heats the circuit board on which the electronic components are arranged in heating oven 26, and thus manufactures a desired circuit board. Thereafter, controller 120 controls robot arm 119 of mounting section 112 based on the data of control program 127. Controller 120 combines multiple circuit boards to manufacture a combined circuit board by controlling robot arm 119.

(2. Operation of Manufacturing Device 10)

Figure 3:
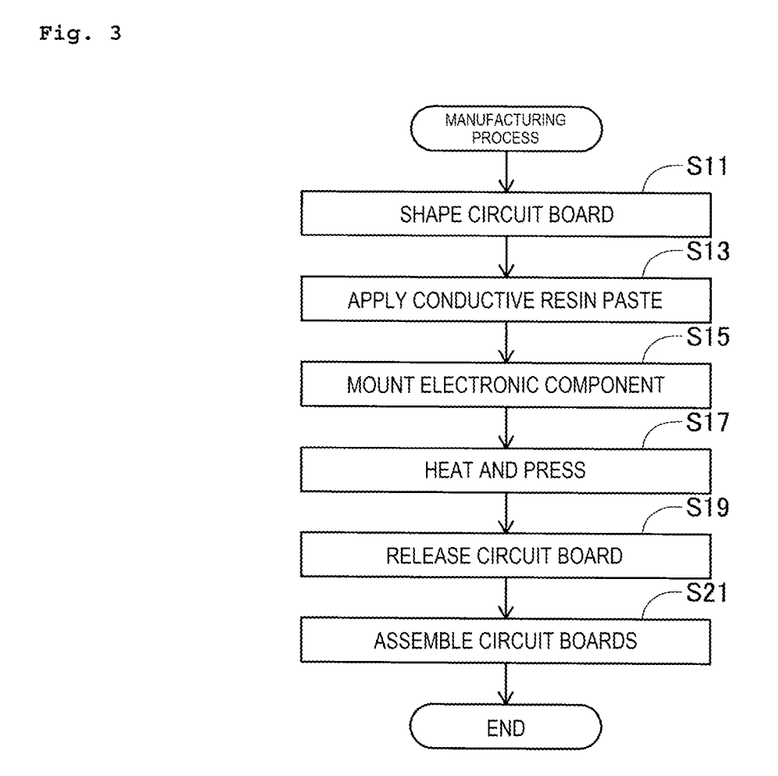
FIG. 3 is a flowchart illustrating details of manufacturing processing for manufacturing a combined circuit board.

Next, an example of an operation of manufacturing device 10 will be described with reference to FIGS. 3 to 9. FIG. 3 is a flowchart illustrating details of a manufacturing process of manufacturing a combined circuit board. For example, when receiving an instruction for starting manufacturing, control device 28 executes a predetermined program in control program 127, and starts the manufacturing process illustrated in FIG. 3. In the following description, the expression that controller 120 executes control program 127 to control each device may be simply referred to as a "device". For example, the expression "controller 120 moves base plate 60" means that "controller 120 executes control program 127, controls an operation of conveyance device 20 via driving circuit 122, and moves base plate 60 through an operation of conveyance device 20".

Figure 4:
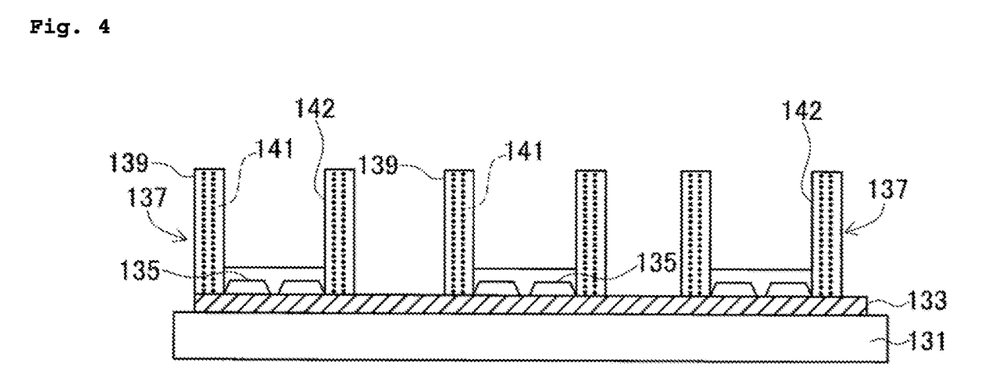
FIG. 4 is a side view schematically illustrating a state of a manufacturing step.

Specifically, when the manufacturing process in FIG. 3 is started, controller 120 controls conveyance device 20 to move base plate 60 on which the base member is set to first shaping unit 22 or second shaping unit 24 in step (hereinafter, simply referred to as S) 11 to shape a circuit board. As illustrated in FIG. 4, release film 133 is adhered to an upper surface of base member 131 fixed to stage 52 (refer to FIG. 1). Release film 133 has an adhesive surface as one of two surfaces, and the adhesive surface is adhered to the upper surface of base member 131. An operation of adhering release film 133 to base member 131 may be automatically executed by controller 120 controlling robot arm 119, or may be manually performed by a human.

Controller 120 controls second shaping unit 24 to eject and cure the ultraviolet curable resin, and thus additively forms an insulating layer on release film 133. The surface of release film 133 on the opposite side to the adhesive surface (the lower surface in the illustrated example) is, for example, a non-adhesive surface having no adhesive property. Controller 120 additively forms a structure (an insulating layer or the like) on the non-adhesive surface. Controller 120 moves stage 52 to first shaping unit 22, so that wirings are additively formed on release film 133 and the insulating layer by first shaping unit 22. Controller 120 causes first shaping unit 22 and second shaping unit 24 to repeatedly execute the shaping. Consequently, as illustrated in FIG. 4, circuit board 137 having wirings 135 is shaped. Wirings 135 are formed in a predetermined pattern, for example, on an upper surface, an inner section, and a lower surface of circuit board 137.

A connection section 139 for electrically connecting any circuit board 137 to another circuit board 137 when the circuit boards are combined as a combined circuit board is shaped on circuit board 137. Connection section 139 is formed in a columnar shape extending in the up-down direction, for example, with an ultraviolet curable resin, and is formed to stand on release film 133. A through-hole extending in the up-down direction is formed in connection section 139, and connection conductor 141 is formed in the through-hole. Connection conductor 141 is, for example, a cylindrical metal rod to which an elastic member such as a spring is attached, and is movable in the up-down direction. Controller 120 shapes, for example, a resin part of connection section 139 with second shaping unit 24, moves stage 52 to mounting unit 27, and attaches connection conductor 141 into the through-hole of connection section 139 with robot arm 119. The operation of attaching connection conductor 141 may be manually performed by a human.

Controller 120 forms accommodation section 142 for arranging electronic components that will be described later on circuit board 137. Accommodation section 142 has, for example, a shape in which circuit board 137 is recessed downward in the Z-axis direction. As illustrated in FIG. 4, controller 120 shapes, for example, multiple circuit boards 137 collectively on release film 133, and then executes assembly. Controller 120 may assemble circuit boards 137 shaped separately in the future.

Figure 5:
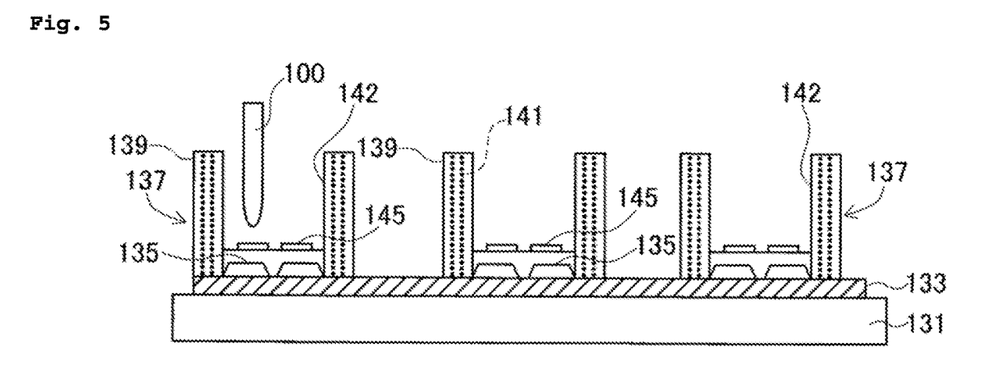
FIG. 5 is a side view schematically illustrating a state of a manufacturing step.

Next, in S13 in FIG. 3, controller 120 moves stage 52 to third shaping unit 25, controls liquid droplet applicator 100, and applies a conductive resin paste. As illustrated in FIG. 5, controller 120 controls liquid droplet applicator 100 to apply conductive resin paste 145 to wirings 135 of circuit board 137.

Figure 6:
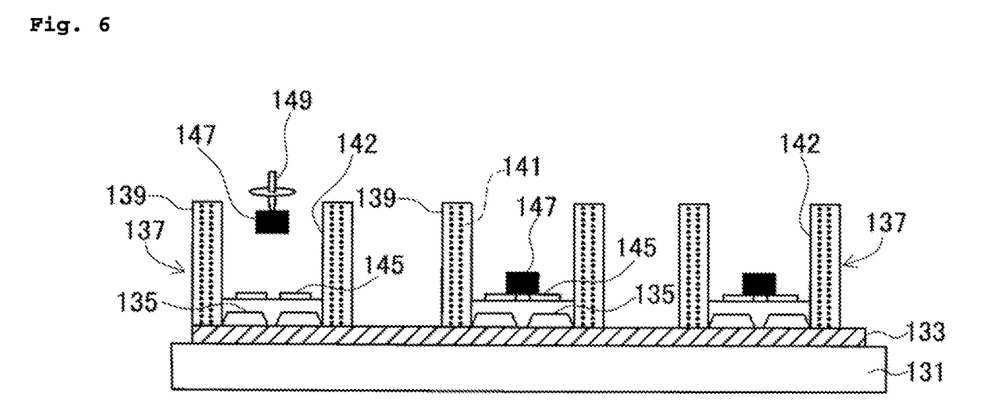
FIG. 6 is a side view schematically illustrating a state of a manufacturing step.

Next, in S15, controller 120 moves stage 52 to mounting unit 27 to mount an electronic component. Controller 120 controls supply section 110 of mounting unit 27 to supply electronic component 147 (refer to FIG. 6). Controller 120 controls movement device 118 of mounting section 112 to move mounting head 116 to a supply position of supply section 110, so that electronic component 147 is picked up and held by suction nozzle 149 (refer to FIG. 6) of mounting head 116. As illustrated in FIG. 6, mounting head 116 mounts electronic component 147 on accommodation section 142 of each circuit board 137 under the control of controller 120. Mounting head 116 arranges electronic component 147 such that an electrode (terminal) of electronic component 147 is connected to wiring 135 of circuit board 137 via conductive resin paste 145.

Figure 7:
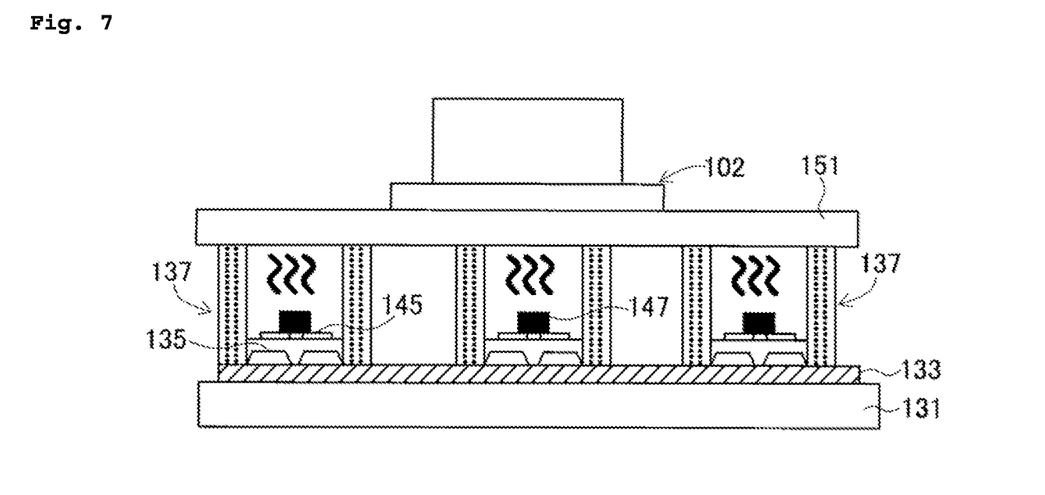
FIG. 7 is a side view schematically illustrating a state of a manufacturing step.

Next, in S17, controller 120 moves stage 52 to heating oven 26 to heat and press circuit board 137. As illustrated in FIG. 7, controller 120 controls press device 102 to arrange base member 131 below press member 151 of press device 102. Press member 151 is arranged above circuit board 137, and is arranged at a position opposed to base member 131 with circuit board 137 interposed therebetween in the up-down direction. Controller 120 moves down press member 151 along the Z-axis direction, for example, in a state in which the position of base member 131, that is, the position of circuit board 137 is fixed. Circuit board 137 is pressed by base member 131 and press member 151 from the up-down direction. The pressure for pressing press member 151 toward base member 131 is, for example, 3 kgf (kilogram weight) per 120 mm×120 mm.

Heating oven 26 starts heating in the oven while pressing with press device 102 under the control of controller 120. Consequently, in circuit board 137, release film 133 and conductive resin paste 145 are collectively heated. Heating oven 26 may start heating first, and may start pressing when the inside of the oven reaches a predetermined temperature.

Release film 133 is easily released from base member 131, for example, by reducing the adhesive force due to heating. Release film 133 is partially or entirely released, for example, from the upper surface of base member 131 by the application of heat. Consequently, base member 131 and release film 133 can be easily separated from each other.

Conductive resin paste 145 applied to circuit board 137 is cured by being heated, and thus the position of electronic component 147 with respect to circuit board 137 is fixed. Conductive resin paste 145 is heated to have high conductivity, and thus wiring 135 formed on the upper surface of circuit board 137 and an electrode of electronic component 147 are electrically connected to each other.

There is concern that circuit board 137 may be warped due to the above-described heating. Thus, circuit board 137 is pressed with press device 102, and thus heating can be performed while correcting the warpage of circuit board 137. In the heating press step in S17, press device 102 of the present embodiment controls heating oven 26 such that heating is performed by using a higher heating temperature of the heating temperature required for releasing release film 133 from base member 131 and the heating temperature required for curing conductive resin paste 145. Specifically, the heating temperature required for releasing release film 133 from base member 131 is 160° C., for example. The heating temperature required for release described herein is, for example, a temperature at which a phenomenon in which release film 133 is released from base member 131 is started, or a temperature at which release film 133 is completely released from base member 131. The heating temperature required for curing conductive resin paste 145 is 120° C., for example. The heating temperature required for curing described herein is, for example, a temperature required for conductive resin paste 145 to exhibit desired electrical characteristics to connect wiring 135 and electronic component 147. The heating temperature required for curing is, for example, a temperature required for completely curing conductive resin paste 145. In this case, heating oven 26 executes the heating press in S17 at 160° C., which is a higher temperature of the two heating temperatures described above. Conversely, in a case where the heating temperature required for releasing release film 133 from base member 131 is higher, heating oven 26 executes the heating press in S17 at that temperature. According to this, heating is performed at a higher heating temperature of the two heating temperatures, and thus the release of release film 133 and the curing of conductive resin paste 145 can be more reliably executed. It is possible to suppress failure of release or incomplete curing and thus to improve the quality of circuit board 137 after manufacturing. Heating oven 26 may execute the heating press in S17, for example, at an average value of the two heating temperatures, or may execute the heating press in S17 at a lower heating temperature of the two heating temperatures.

Heating oven 26 executes heating for a longer heating time out of the heating time required for releasing release film 133 from base member 131 and the heating time required for curing conductive resin paste 145 in the heating press in S17. For example, in a case where the heating time required for releasing release film 133 from base member 131 is longer out of the two heating times, heating oven 26 continues the heating press for the longer heating time. The heating time described herein is, for example, a heating time recommended by a maker of conductive resin paste 145 or release film 133 (a heating time at a recommended temperature). Specifically, the heating time required for releasing release film 133 from base member 131 is a time period from the time at which release film 133 starts to be released due to the adhesive force thereof being reduced to the time at which the entire release of release film 133 is completed in a case where release film 133 is heated at the recommended temperature. The heating time required for curing conductive resin paste 145 is a time period from the starting of curing of conductive resin paste 145 to the complete completion of curing of conductive resin paste 145 in a case where conductive resin paste 145 is heated at a recommended temperature. According to this, heating is performed at a longer heating time out of the two heating times, and thus the release of release film 133 and the curing of conductive resin paste 145 can be more reliably executed, so that the quality of the circuit board after manufacturing can be improved. Heating oven 26 may execute the heating press in S17 at an average value of the two heating times, or may execute the heating press in S17 at a shorter heating time out of the two heating times, for example.

Therefore, in manufacturing device 10 of the present embodiment, base member 131, release film 133, circuit board 137, and press member 151 are placed in heating oven 26, and release film 133 and conductive resin paste 145 are heated. According to this, circuit board 137 and the like are placed in heating oven 26 and heated while being pressed. Consequently, entire circuit board 137 can be heated, and thus the release of release film 133 and the curing of conductive resin paste 145 can be performed more reliably.

Figure 8:
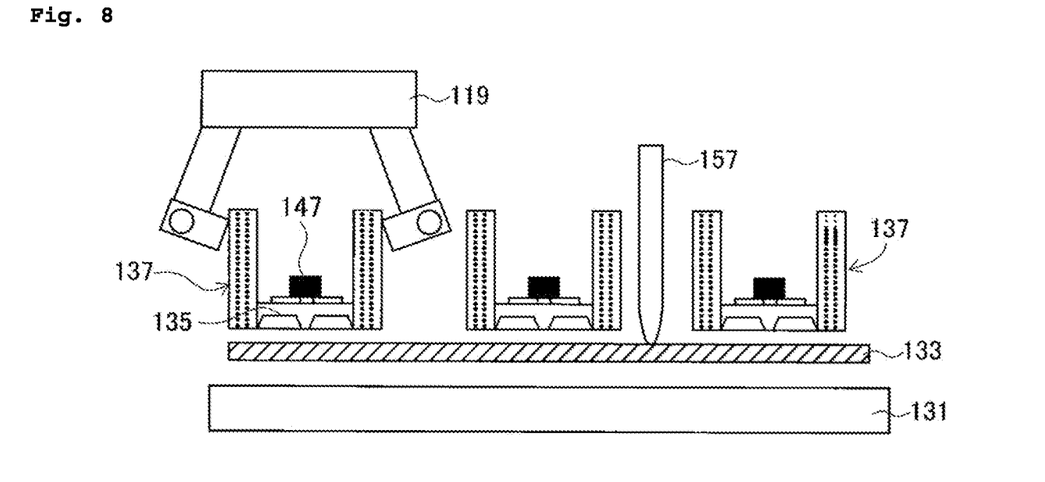
FIG. 8 is a side view schematically illustrating a state of a manufacturing step.

Next, in S19, controller 120 moves stage 52 to mounting unit 27, and circuit board 137 is detached from release film 133. As illustrated in FIG. 8, robot arm 119 of mounting section 112 detaches any circuit board 137, for example, from release film 133 and base member 131 under the control of controller 120. In a case where circuit board 137 is attached to release film 133 when circuit board 137 is detached, mounting head 116 may use presser rod 157 or the like to press release film 133 against base member 131 to detach circuit board 137 from release film 133, as illustrated in FIG. 8. Robot arm 119 may rotate circuit board 137 about a rotation axis along the Z-axis direction such that circuit board 137 is released from release film 133.

Figure 9:
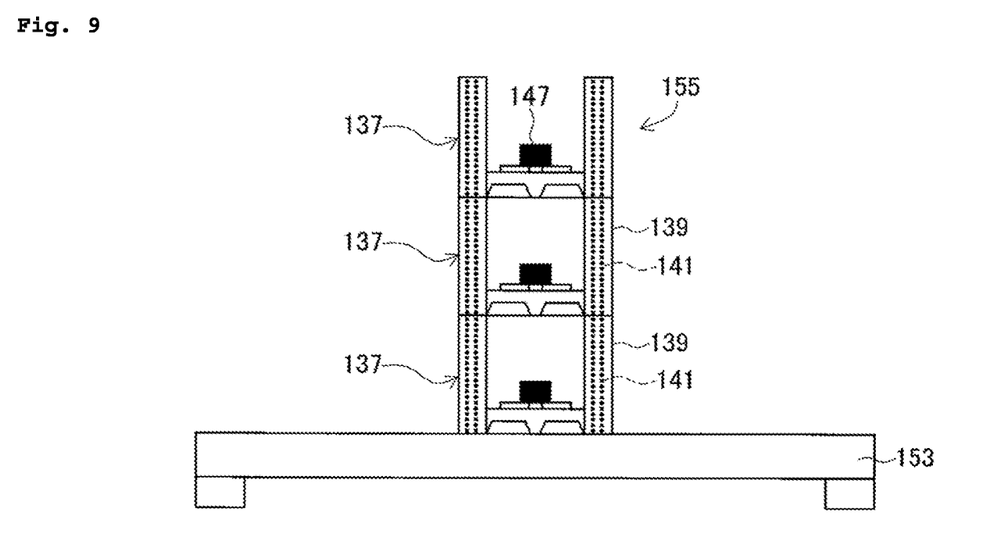
FIG. 9 is a side view schematically illustrating a state of a manufacturing step.

Robot arm 119 assembles combined circuit board 155 by using detached circuit board 137 (S21). As illustrated in FIG. 9, robot arm 119 arranges detached circuit board 137 on assembling table 153 (refer to FIG. 9) of mounting section 112. Robot arm 119 arranges circuit board 137 that has been detached on or beside circuit board 137 arranged on assembling table 153 (arranged on the upper side in the illustrated example). Robot arm 119 fixes arranged multiple circuit boards 137 to each other to manufacture combined circuit board 155. A method for fixing multiple circuit boards 137 is not particularly limited, but, for example, an adhesive, a screw, a bolt, or the like may be used. The fixing operation may be automatically executed by robot arm 119 or may be manually executed by a human. Assembled multiple circuit boards 137 are electrically connected to each other via connection conductors 141 of connection section 139. Connection conductor 141 includes an attached elastic member, and thus absorbs shock at the time of assembling.

A structure of combined circuit board 155 is not particularly limited. For example, controller 120 may manufacture combined circuit boards 155 having various shapes or structures based on information (three-dimensional data or the like) of combined circuit board 155 set in control program 127. When the assembling operation in S21 is completed, controller 120 discharges assembling table 153 to the outside of manufacturing device 10. A user can acquire completed combined circuit board 155. Controller 120 finishes the manufacturing process illustrated in FIG. 3.

Therefore, manufacturing device 10 of the present embodiment combines circuit board 137 detached from release film 133 with another circuit board 137 and manufacture combined circuit board 155 including multiple circuit boards 137. According to this, by combining multiple circuit boards 137 in which the heat damage is reduced while correcting the warpage, it is possible to accurately assemble circuit boards 137 while suppressing positional deviation of multiple circuit boards 137. Therefore, desired combined circuit board 155 can be manufactured with good precision.

According to the above embodiment, the following advantages can be achieved. Controller 120 of manufacturing device 10 additively forms circuit board 137 on release film 133 adhered to base member 131 (S11), and attaches conductive resin paste 145 to wirings 135 of circuit board 137 (S13). Controller 120 arranges electronic component 147 on circuit board 137 to arrange electronic component 147 and circuit board 137 via conductive resin paste 145 (S15). Controller 120 controls heating oven 26 to collectively heat release film 133 and conductive resin paste 145 while pressing circuit board 137 with base member 131 and press member 151 (S17).

Consequently, release film 133 and conductive resin paste 145 are collectively heated while correcting the warpage of circuit board 137 due to the heating by the pressing of base member 131 and press member 151. The two heating steps including the step of heating release film 133 and the step of heating conductive resin paste 145 can be combined to heat circuit board 137 while suppressing warpage of circuit board 137. By reducing the number of heating steps, it is possible to reduce the influence of thermal stress on circuit board 137 (such as damage to the board due to heat or release of a wiring) and thus to improve the quality of circuit board 137 after manufacturing. By reducing the number of manufacturing steps, the production efficiency can be improved, and thus the manufacturing cost can be reduced.

As illustrated in FIG. 2, controller 120 of control device 28 includes board shaping section 161, attachment section 162, an electronic component arrangement section 163, heating press section 164, and circuit board assembling section 165. Board shaping section 161 is a functional section that causes first shaping unit 22 and second shaping unit 24 to additively form circuit board 137 having wirings 135 on release film 133 adhered to base member 131. Attachment section 162 is a functional section that attaches conductive resin paste 145 contacting wiring 135 to circuit board 137. Electronic component arrangement section 163 is a functional section that causes mounting head 116 to arrange electronic component 147 on circuit board 137 such that electronic component 147 and wiring 135 are arranged via conductive resin paste 145. Heating press section 164 is a functional section that arranges press member 151 above circuit board 137, causes heating oven 26 to move press member 151, and presses circuit board 137 with base member 131 and press member 151 to correct the warpage of circuit board 137. Heating press section 164 is a functional section that releases release film 133 from base member 131 and cures conductive resin paste 145 by collectively heating release film 133 and conductive resin paste 145 with heating oven 26 while correcting the warpage. Circuit board assembling section 165 is a functional section that manufactures combined circuit board 155 including multiple circuit boards 137 by combining circuit board 137 detached from release film 133 with another circuit board 137.

In the above embodiment, controller 120 is an example of a control device. Release film 133 is an example of a peeling member. Conductive resin paste 145 is an example of a metal paste. First shaping unit 22 and second shaping unit 24 are examples of an additive manufacturing device. Heating oven 26 is an example of a heating press device. Controller 120 is an example of a control device. The process in S11 is an example of a board shaping step. The process in S13 is an example of an attachment step. The process in S15 is an example of an electronic component arrangement step. The process in S17 is an example of a heating press step. The process in S21 is an example of a circuit board assembling step.

The present application is not limited to the above examples, and may be implemented in various aspects in which various changes and improvements are made based on the knowledge of those skilled in the art. For example, a material used in the additive manufacturing method may be changed as appropriate. For example, the insulating layer of circuit board 137 may be shaped by using a thermosetting resin instead of an ultraviolet curable resin. As a metal used for wiring 135 or conductive resin paste 145, a metal (gold, copper, or the like) other than silver may be used. In the above embodiment, wiring 135 is formed of metal ink, but wiring 135 may be formed of conductive resin paste 145. The structure of circuit board 137 described above is an example. For example, accommodation section 142 of circuit board 137 is not limited to a structure in which electronic component 147 is inserted from the top, but may have a structure in which electronic component 147 is inserted from the side. Circuit board 137 does not have to include accommodation section 142. For example, circuit board 137 may have a configuration in which a lower surface is recessed, an upper surface is formed in a plane, and electronic component 147 is arranged on the upper surface thereof. A recessed section of another circuit board 137 may be assembled on the upper surface of any circuit board 137. In the above embodiment, conductive resin paste 145 is applied by liquid droplet applicator 100, but may be ejected by a dispense head. Conductive resin paste 145 may be printed through screen printing. The peeling member of the present disclosure is not limited to a film-like member, and various members having adhesiveness and of which the adhesiveness is reduced through application of heat may be employed.

Figure 10:
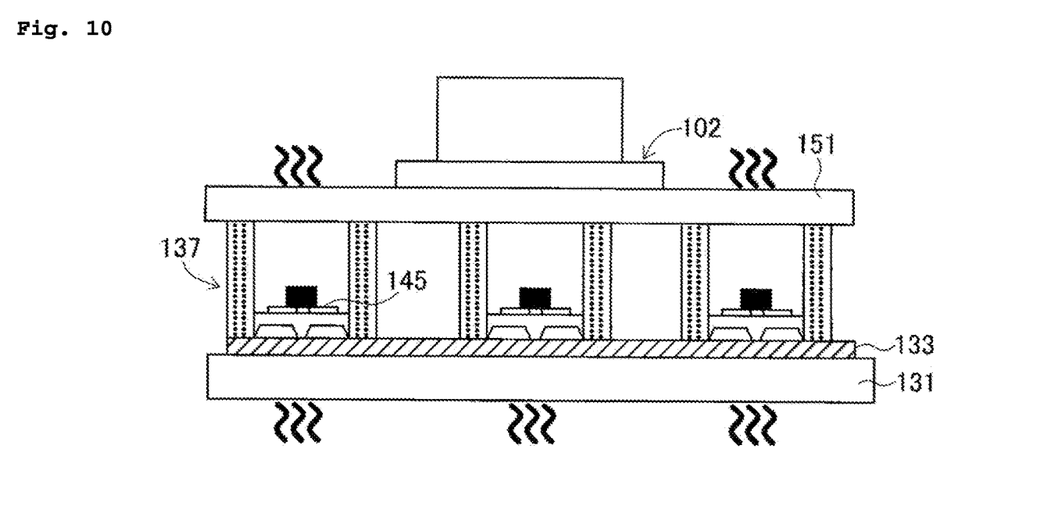
FIG. 10 is a side view schematically illustrating a state of a manufacturing step according to another example.

In the above embodiment, the heating of release film 133 and conductive resin paste 145 is executed in heating oven 26, but is not limited to this. For example, as illustrated in FIG. 10, release film 133 and conductive resin paste 145 may be heated by heating base member 131 and press member 151. Although a method for heating base member 131 and press member 151 is not particularly limited, for example, base member 131 and press member 151 may be formed of a metal plate and warmed by a halogen heater. Alternatively, a current may be caused to flow through base member 131 or the like to warm base member 131 or the like. Heat may be transmitted from base member 131 and press member 151 to circuit board 137, and thus conductive resin paste 145 may be heated. Heat may be transmitted from base member 131 to release film 133, and thus the adhesive force may be reduced.

Therefore, release film 133 and conductive resin paste 145 may be heated by heating base member 131 and press member 151. Consequently, heat is applied from both base member 131 and press member 151 to circuit board 137 and release film 133, and thus circuit board 137 and the like can be more uniformly heated such that the release of release film 133 and the curing of conductive resin paste 145 can be executed more reliably. Both the method for heating with heating oven 26 and the method for heating base member 131 and press member 151 described above may be used. For example, heating may be performed by causing a current to flow to base member 131 and press member 151 in heating oven 26.

Figure 11:
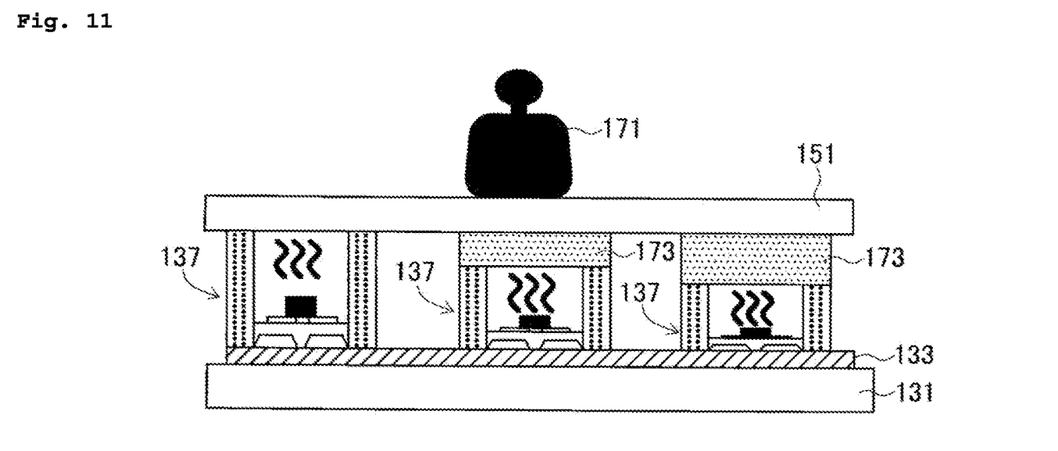
FIG. 11 is a side view schematically illustrating a state of a manufacturing step according to yet another example.

In the above embodiment, the pressing of circuit board 137 is executed by press device 102, but is not limited to this. For example, as illustrated in FIG. 11, weight 171 may be placed on press member 151, and pressing may be executed through weighting using weight 171. The work of placing weight 171 on press member 151 may be automatically executed by robot arm 119 or the like, or may be manually performed by a human.

Figure 12:
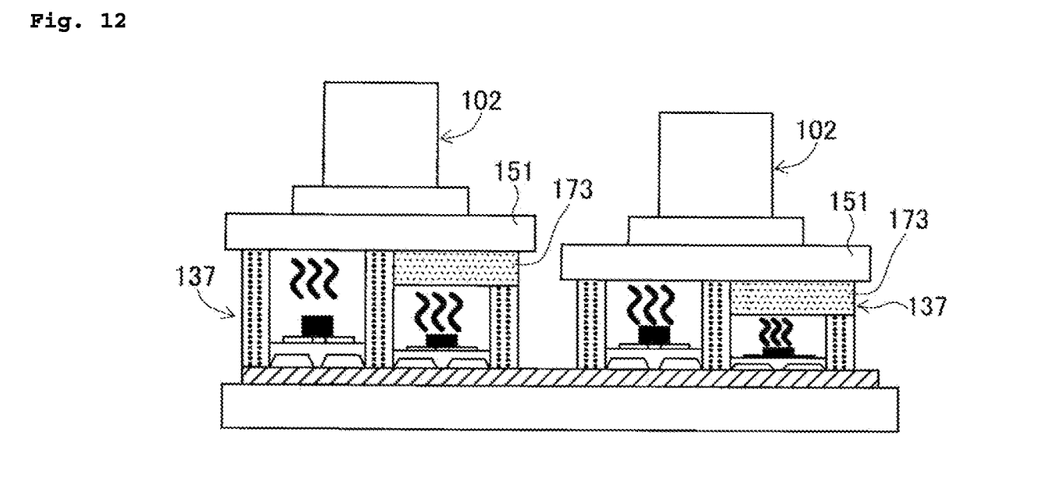
FIG. 12 is a side view schematically illustrating a state of a manufacturing step according to still yet another example.

As illustrated in FIG. 11, in a case where heights of multiple shaped circuit boards 137 are different from each other, or as illustrated in FIG. 12, in a case where sections having different heights are formed on one circuit board 137, heating press may be performed with adjustment member 173 for adjusting a height interposed between circuit board 137 and press member 151. Adjustment member 173 is preferably a member having heat resistance, and may be, for example, a member obtained by overlapping a tape formed of a heat-resistant material such as polyimide. Alternatively, adjustment member 173 may be an elastic member such as heat-resistant rubber. The work of arranging adjustment member 173 may be automatically performed by placing adjustment member 173 on circuit board 137 by using robot arm 119 or the like, or may be manually performed by a human.

In the additive manufacturing method, not only circuit boards 137 having the same height but also circuit boards 137 having different heights or circuit boards 137 having partially different heights may be shaped in accordance with the purpose. For example, a height and a shape of each circuit board 137 may be changed in accordance with a shape of an article to which combined circuit board 155 is to be mounted, or a height of circuit board 137 may be partially reduced in order to reduce the material cost. On the other hand, when circuit boards 137 having different heights are to be pressed, there is concern that a gap may be formed between press member 151 and circuit board 137 and thus the warpage of circuit board 137 cannot be appropriately corrected. Therefore, as illustrated in FIGS. 11 and 12, by interposing adjustment member 173 between circuit board 137 and press member 151 and performing heating press, it is possible to apply a pressing force from press member 151 to circuit board 137 via adjustment member 173, and thus the warpage of circuit board 137 can be appropriately corrected.

As illustrated in FIG. 12, multiple press devices 102 or weight 171 (refer to FIG. 11) may be used to press circuit boards 137 having different heights in whole or in part by each press device 102 or the like. That is, in a case where multiple circuit boards 137 are collectively heated, each circuit board 137 may be pressed individually. Sections having different heights in one circuit board 137 may be pressed by respective press devices 102. The configuration of manufacturing device 10 illustrated in FIG. 1 and FIG. 2 in the above embodiment is an example. For example, manufacturing device 10 does not have to include heating oven 26 or robot arm 119. In this case, the heating process or the assembling process may be performed in a device different from manufacturing device 10.

REFERENCE SIGNS LIST

10: Circuit board manufacturing device, 22: First shaping unit (additive manufacturing device), 24: Second shaping unit (additive manufacturing device), 26: Heating oven (heating press device), 28: Control device, 116: Mounting head, 120: Controller (control device), 131: Base member, 133: Release film (peeling member), 145: Conductive resin paste (metal paste), 151: Press member, 155: Combined circuit board, 161: Board shaping section (board shaping step), 162: Attachment section (attachment step), 163: Electronic component arrangement section (electronic component arrangement step), 164: Heating press section (heating press process), 165: Circuit board assembling (circuit board assembling step), 173: Adjustment member

The invention claimed is:

1. A circuit board manufacturing method comprising:
a board shaping step of using an additive manufacturing device to laminate and shape a circuit board having a wiring on a peeling member adhered to a base member;
an attachment step of using a metal paste applicator to attach a metal paste to the circuit board contacting the wiring of the circuit board;
an electronic component arrangement step of using a mounting head to arrange an electronic component on the metal paste contacting the wiring of the circuit board; and
a heating press step of arranging a press member above the circuit board opposite to the base member and pressing the circuit board with the electronic component between the base member and the press member while collectively heating the peeling member and the metal paste, thereby simultaneously causing the peeling member to be released from the base member, curing the metal paste to electrically connect the electronic component to the wiring, and correcting warpage of the circuit board.

2. The circuit board manufacturing method according to claim 1, wherein
a heating temperature of the heating press step is a higher temperature out of a heating temperature required for releasing the peeling member from the base member and a heating temperature required for curing the metal paste.

3. The circuit board manufacturing method according to claim 1, wherein
a heating time in the heating press step is a longer time out of a heating time required for releasing the peeling member from the base member and a heating time required for curing the metal paste.

4. The circuit board manufacturing method according to claim 1, wherein
in the heating press step, the base member, the peeling member, the circuit board, and the press member are placed in a heating oven, and the peeling member and the metal paste are heated.

5. The circuit board manufacturing method according to claim 1, wherein
the base member and the press member are plates made of metal, and
in the heating press step, the peeling member and the metal paste are heated by heating the base member and the press member.

6. The circuit board manufacturing method according to claim 1, wherein
in the heating press step, heating press is executed with an adjustment member, which adjusts a height, interposed between the circuit board and the press member.

7. The circuit board manufacturing method according to claim 1 further comprising:
a circuit board assembling step of manufacturing a combined circuit board including multiple circuit boards by detaching the peeling member from the circuit board released from the base member and combining the circuit board detached from the peeling member with another circuit board.

8. A circuit board manufacturing device comprising: an additive manufacturing device;
a metal paste applicator;
a mounting head;
a heating press device; and
a control device,
wherein the control device includes:
a board shaping section configured to cause the additive manufacturing device to additively laminate and shape a circuit board having a wiring on a peeling member adhered to a base member;
an attachment section configured to cause the metal paste applicator to attach a metal paste to the circuit board contacting the wiring of the circuit board;
an electronic component arrangement section configured to cause the mounting head to arrange an electronic component on the metal paste contacting the wiring of the circuit board; and
a heating press section configured to arrange a press member of the heating press device above the circuit board opposite to the base member and cause the heating press device to move the press member to press the circuit board with the electronic component between the base member and the press member while collectively heating the peeling member and the metal paste, thereby simultaneously causing the peeling member to release from the base member, curing the metal paste to electrically connect the electronic component to the wiring, and correcting warpage of the circuit board.

* * * * *